(12) United States Patent
Muroi et al.

(10) Patent No.: US 7,301,513 B2
(45) Date of Patent: Nov. 27, 2007

(54) DISPLAY ELEMENT AND DISPLAY DEVICE

(75) Inventors: Takao Muroi, Yamatokoriyama (JP);
Takahiro Senda, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 652 days.

(21) Appl. No.: 10/872,093

(22) Filed: Jun. 17, 2004

(65) Prior Publication Data

US 2004/0257359 A1  Dec. 23, 2004

(30) Foreign Application Priority Data

Jun. 19, 2003 (JP) ............................ P2003-175481
Mar. 3, 2004 (JP) ............................ P2004-059620

(51) Int. Cl.
*G09G 3/30* (2006.01)

(52) U.S. Cl. ............................ 345/76; 345/81; 345/84; 345/80; 345/89; 345/690; 315/169.1; 315/169.2; 315/169.3

(58) Field of Classification Search ............ 345/74–84, 345/90, 93, 204, 690
See application file for complete search history.

(56) References Cited

U.S. PATENT DOCUMENTS

2003/0197665 A1* 10/2003 Sung ............................ 345/82
2004/0080474 A1*  4/2004 Kimura ........................ 345/82
2006/0001623 A1*  1/2006 Sung ............................ 345/77

FOREIGN PATENT DOCUMENTS

JP        11-073158     3/1999
JP        2001-272930   10/2001
JP        2002-175029   6/2002

OTHER PUBLICATIONS

Hunter et al., "Active Matrix Addressing of Polymer Light Emitting Diodes Using Low Temperature Poly Silicon TFTs," *AM-LCD2000*, pp. 249-252 (2000).
Hattori et al., "Circuit Simulation of Poly-Si TFT Based Current-writing Active-Matrix Organic LED Display," *Technical Report of IEICE*, vol. 101, No. 15 pp. 7-14 (Apr. 2001).

* cited by examiner

*Primary Examiner*—Richard Hjerpe
*Assistant Examiner*—Jennifer T Nguyen
(74) *Attorney, Agent, or Firm*—Davd G. Conlin; David A. Tucker; Edwards Angell Palmer & Dodge LLP

(57) ABSTRACT

A display element is configured as follows in order to prolong the display lifetime of an electro-optical element without inserting a resistance element or lowering the numerical aperture due to a change in layout. The display element includes an organic EL element, which is an electro-optical element, a power source line electrode, a scanning signal line electrode, a data signal line electrode, a common electrode, an auxiliary capacitance, a current control TFT for controlling the current flowing through the organic EL element, and a data voltage control TFT for controlling the timing at which current flows through the organic EL element. The conductive resistance of the current control TFT is set such that $0.1 \leq \beta \leq 7.0$, where $\beta(=Vr/Vel)$ is a ratio of a voltage Vr applied across the current control TFT to a voltage Vel applied across the organic EL element. Thus, the speed of the temporal change of the luminance of the organic EL element is slowed down, and the display lifetime is prolonged.

15 Claims, 10 Drawing Sheets

DISPLAY ELEMENT AND DISPLAY DEVICE

BACKGROUND OF THE INVENTION

1. Field of the Invention

The present invention relates to display elements in which light emission is controlled by the amount of current flowing through an electro-optical element, as well as to display devices including such display elements.

2. Description of the Related Art

Conventionally, there are display elements using, as electro-optical elements, elements whose light emission amount is controlled by the amount of current flowing through the elements, for example LEDs (light emitting diodes) for which inorganic EL (electroluminescent) elements and organic EL elements are typical examples. In this specification, "electro-optical elements" mean any elements whose optical characteristics are changed by applying electricity, such as not only the aforementioned organic EL elements etc., but also FEDs (field emission displays), charge-driven elements, liquid crystals, E-ink (electronic ink) and the like. It should be noted that in the following, organic EL elements are taken as an example of electro-optical elements, but the same explanations are also possible for any light emitting element whose light emission amount is controlled by a current amount.

Furthermore, there are display devices, in which a plurality of display elements are arranged in a matrix, such that pixels are formed with the display elements. Each display element includes a switching element, which controls the amount of current flowing through the electro-optical element, in accordance with an external electrical signal. Examples of such switching elements are diodes and MIM (metal insulator metal) elements, but more preferable are thin film transistors (referred to in short as "TFTs" in the following) using amorphous silicon or polycrystalline silicon, which has better switching characteristics, continuous grain silicon (referred to in short as "CG silicon" in the following), which is a polycrystalline silicone with higher crystallinity, or an organic material film having a conductivity that is different from that of silicon films. Depending on the form of the electrical signals controlling the amount of current flowing through such an electro-optical element, the control methods can be broadly classified into two methods, namely the constant voltage control method and the constant current control method, which are described below.

First, the constant voltage control method is described. FIG. 12 is a diagram showing an equivalent circuit of a display element forming one pixel. This display element includes an organic EL element 920, which is an electro-optical element, a power source line electrode 912, which supplies current from a driving power source Vref, a scanning signal line electrode 910, a data signal line electrode 911, a common electrode Vcom, an auxiliary capacitance 930, a current control TFT 92, which is a p-channel TFT for controlling the current flowing through the organic EL element 920, and a data voltage control TFT 91, which is an n-channel TFT for controlling the timing at which current flows through the organic EL element 920.

As shown in FIG. 12, the source terminal of the current control TFT 92 and one side of the auxiliary capacitance 930 are connected to the power source line electrode 912, whereas the other side of the auxiliary capacitance 930 is connected to the gate terminal of the current control TFT 92 and the drain terminal of the data voltage control TFT 91. Moreover, the source terminal of the data voltage control TFT 91 is connected to the data signal line electrode 911, and the gate terminal of the data voltage control TFT 91 is connected to the scanning signal line electrode 910. Furthermore, the anode of the organic EL element 920 is connected to the drain terminal of the current control TFT 92, whereas the cathode of the organic EL element 920 is connected to the common electrode Vcom. With the constant voltage control method, by applying a data signal voltage to the data signal line electrode 911 in the period in which the data voltage control TFT 91 is selected by a scanning signal applied to the scanning signal line electrode 910, a voltage corresponding to that data signal voltage is held by the auxiliary capacitance 930. After that, in the period in which the data voltage control TFT 91 is not selected, the conductance of the current control TFT 92 is controlled in accordance with the voltage held by the auxiliary capacitance 930, so that a predetermined current flows through the organic EL element 920, which is connected in series to this current control TFT 92, thus controlling the light emission amount of the organic EL element 920. This configuration is described, for example, in "Active Matrix Addressing of Polymer Light Emitting Diodes Using Low Temperature Poly Silicon TFTs" by I. M. Hunter et. al., AM-LCD2000, 2000, pp. 249 to 252.

Moreover, in order to control the light emission amount and to achieve a display device with high image quality, it is preferable that the potential that is held by the auxiliary capacitance is changed discretely by making this data signal a digital signal, and it is known that for this, it is preferable that the ON resistance of the current control TFT is negligibly small compared to the ON resistance of the light emitting pixel. Such a configuration is described for example in JP H11-73158A.

In contrast to this constant voltage control method, in the constant current control method, a voltage with which the current is obtained that is supposed to flow through the organic EL element 920 is held by the auxiliary capacitance, due to the data signal current that flows through the data signal line electrode of the display element shown in FIG. 12. The light emission amount of the organic EL element 920 is controlled through the voltage held by this auxiliary capacitance 930. The following is a more specific explanation of a configuration for letting the current flow that is supposed to flow through the display element.

FIG. 13 is a diagram showing an equivalent circuit of a conventional example of a display element according to the constant current control method. As shown in FIG. 13, a constant current circuit is connected to the data signal line electrode 911, and TFTs 93 and 94 as well as a signal line electrode 940 for controlling the TFT 94 are further provided in the display element. Like the TFT 91, the TFT 93 is controlled by the scanning signal line electrode 910.

First, when the TFTs 91 and 93 are ON, and the TFT 94 is OFF, a current flows from the driving power source Vref through the TFT 93 to the constant current circuit connected to the data signal line electrode 911, until the current flowing between the source and drain of the TFT 92 takes on a desired value. In this situation, a voltage that is such that a current can flow between source and drain of the TFT 92 is stored in the auxiliary capacitance 930, so that after the TFTs 91 and 93 are switched OFF, the desired current can be caused to flow though the organic EL element 920 by switching the TFT 94 ON. This configuration is described, for example, in "Circuit Simulation of Current-Specified Polysilicon TFT Active Matrix Driven Organic LED Displays," Reiji Hattori et. al., SHINGAKU GIHO, April 2001, ED 2001-8, SDM 2001-8, Vol. 101, No. 15, pp. 7-14.

The following is a description of the relation between the current flowing through the organic EL element 920 and the light emission amount of the organic EL element 920. FIG. 14 shows the relation between the emitted luminance of an organic EL element and the current flowing at the time of emission. As shown in FIG. 14, the emitted luminance of the organic EL element is substantially proportional to the current flowing through the organic EL element, that is, the driving current of the current control TFT 92 shown in FIG. 12. This relation is generally well known.

In the constant voltage control method, when the internal resistance of the organic EL element increases over time (mainly caused by element deterioration due to reactions between moisture and oxygen, decomposition of the material, and changes in the shape of the film layers), then current flowing through the organic EL element is relatively reduced, because the load of the power source is relatively increased. And thus, since the emitted luminance is proportional to the current flowing at the time of the emission, as shown in FIG. 14, also the emitted luminance of the organic EL element is relatively decreased.

On the other hand, with the constant current control method, the current of the data signal is controlled such that a constant current flows through the organic EL element, regardless of the passage of time (and the increase of the internal resistance over time). Therefore, a reduction of the emitted luminance due to a decrease of the flowing current as described above does not occur. However, ordinary organic EL elements have the characteristic that their emitted luminance for a given current decreases over time (due to deterioration of the element), so that also with the constant current control method, a decrease in emitted luminance occurs over the course of time.

FIG. 15 is a diagram illustrating the decrease in emitted luminance over the course of time in organic EL elements with the constant voltage control method and the constant current control method. Curve A shows the case of the constant voltage control method, whereas curve B shows the case of the constant current control method. Moreover, for the normalized time shown in FIG. 15, the time when the normalized luminance for the constant voltage control method has been reduced by half (i.e. reduced to 0.5) is taken as 1. As shown in FIG. 15, the display lifetime of the display apparatus with the constant current control method is longer than that with the constant voltage control method. It should be noted that this display lifetime means the time until, due to deterioration over time, the elements emitting a predetermined luminance reach a luminance at which they cannot be used anymore for a display device, that is, the time until the aforementioned predetermined luminance has been reduced approximately by half.

This decrease of the emitted luminance due to deterioration over time is subject to variations caused by differences in the emission history of each organic EL element, which causes variations in the characteristics of the TFT elements included in the display panel. To address this problem, it is known to connect the organic EL element in series with a resistance element, to adjust the voltage applied to the organic EL element by voltage division, and to reduce the relative variations in the emitted light. Such a configuration is disclosed in JP 2001-272930A, pages 3 and 4, FIG. 1 and JP 2002-175029A, pages 6-8, FIGS. 2 and 5 to 7.

In this configuration, a predetermined resistance element R is further connected in series to the organic EL element 920 of the display element shown in FIG. 12, in addition to the current control TFT 92. FIG. 16 is a diagram showing an equivalent circuit of a display element according to this conventional example. As shown in FIG. 16, by increasing the internal resistance of the organic EL element 920, even if the current that flows is lowered over time from a predetermined value, it is possible to increase the voltage applied to the organic EL element 920 with the internal resistance of the organic EL element 920, in accordance with the rule of voltage division. Therefore, a reduction of the luminance due to a temporal reduction of the current can be inhibited. Consequently, even for the case of the constant voltage control method, it is possible to realize a display device in which the reduction of the emitted luminance is inhibited, as in the case of the constant current control method.

However, in configurations performing control in accordance with a digital data signal with the constant voltage control method, as in these conventional configurations (see for example the configuration in JP H11-73158A), it is preferable that the resistance of the current control TFT element is so small that it can be ignored, so that in order to increase the display lifetime in this configuration, the above-noted configuration is necessary in which the voltage applied to the organic EL element due to voltage division is increased in accordance with the internal resistance of the organic El element, by connecting a resistance element in series to the organic EL element within the display element. As an alternative method for increasing the display lifetime, it is conceivable to configure a display element with the constant current control method in which a constant current can always be caused to flow through the organic EL element, regardless to the rules of voltage division. However, in such a configuration, the number of switching elements and resistances included in the display element increases compared to the display element shown in FIG. 12. Therefore, the surface area occupied by these increases, so that the proportion of the surface area occupied by those elements to the surface area of the overall display element increases as well. As a result, the light emission area of the light emitting element is reduced, so that the numerical aperture of the display element is reduced.

In order to realize the same display luminance as with the display element of the circuit configuration shown in FIG. 12 with a configuration in which the numerical aperture is reduced, as described above, it is necessary to increase the luminance of the organic EL element included in the display element. However, it is well known that when the luminance of the organic EL element is stepped up, then the deterioration of the organic EL element occurs even earlier, thus shortening the display lifetime. Moreover, the light emission efficiency of the organic EL element is reduced, and also the power consumption of the organic EL element is relatively increased, so that also in view of the display characteristics, it is not preferable to step up the luminance of the organic EL element.

It should be noted that the explanations here relate to an organic EL element as an example of an electro-optical element, but there is no limitation to organic EL elements, and similar problems occur also with other light emitting elements in which the light emission amount of the element is controlled in accordance with the current amount flowing through the element.

SUMMARY OF THE INVENTION

It is thus an object of the present invention to provide a display element and a display device with which the temporal luminance deterioration of the electro-optical element can be compensated and the display lifetime can be prolonged, without inserting a resistance element in series as described above, and without lowering the numerical aperture by increasing the number of TFTs within the display element and drastically changing the layout of the display element.

In order to attain this and other objects of the present invention, a display element in accordance with an aspect of the present invention comprises:

an electro-optical element that is driven by a current;

a current control element for letting a current flow through the electro-optical element by being connected in series to the electro-optical element;

a switching element for applying to the current control element a data signal for controlling the current control element;

a scanning signal line electrode for applying to the switching element a scanning signal for controlling the switching element;

a data signal line electrode for applying to the switching element the data signal; and a power source line electrode for applying to the current control element a current for driving the electro-optical element;

wherein the current control element has a predetermined conductive resistance satisfying $0.1 \leq \beta \leq 7.0$, where $\beta(=Vr/Vel)$ is a ratio of a voltage Vr applied across the current control element to a voltage Vel applied across the electro-optical element, when the electro-optical element is emitting light.

In accordance with another aspect of the present invention, when the withstand voltage to the voltage applied across the current control element takes on a small value (for example a value of maximally 8 V), then it is preferable that the ratio $\beta(=Vr/Vel)$ is in the range of $0.1 \leq \beta \leq 3.0$.

Moreover, it is preferable that the current control element is a thin film transistor, which can be formed on a glass substrate, more preferably a thin film transistor made of polycrystalline silicon. The current control element may be a p-channel or an n-channel thin film transistor. Furthermore, the current control element may be made of CG silicon, which can cause a larger current to flow than polycrystalline silicon. Moreover, the electro-optical element may be an organic electroluminescent element.

In accordance with another aspect of the present invention, the current control element may be formed so as to have the predetermined conductive resistance. More specifically, the current control element (thin film transistor or the like) may be adjusted to have the predetermined conductive resistance by forming a gate width or a gate length of the current control element with a predetermined length. Moreover, the current control element may be controlled such that it has a predetermined conductance satisfying $0.1 \leq \beta \leq 7.0$, by applying a data signal having a predetermined voltage.

A display device in accordance with an aspect of the present invention comprises a display portion in which a plurality of display elements as described are arranged in Matrix, and considering that there are variations in the element characteristics of the current control element, as in thin film transistors, the variations in the gray levels are ordinarily large with analog control methods, so that it is preferable that the electro-optical element included in the display device is gray scale controlled with binary values, setting the electro-optical element to an emitting or a non-emitting state, as with the subfield method (moving images having intermediate gray levels are divided into a plurality of weighted binary images, and intermediate gray levels are displayed by overlapping those binary images in time) or the method of gray level controlling electro-optical elements of different light emission areas with binary digital data signals (see for example the method disclosed in JP H11-73158A).

With the present invention as described above, the conductive resistance of the current control element is set such that the ratio $\beta(=Vr/Vel)$ of a voltage Vr applied across the current control element to a voltage Vel applied across the electro-optical element when the electro-optical element is emitting light satisfies $0.1 \leq \beta \leq 7.0$. Thus, the speed of change over time of the luminance of the electro-optical element can be slowed down and the display lifetime of the electro-optical element can be prolonged, without inserting a new resistance element, and without including special compensation circuitry as used in display elements and display devices with the constant current control method.

These and other objects, features, aspects and advantages of the present invention will become more apparent from the following detailed description of the present invention when taken in conjunction with the accompanying drawings.

DESCRIPTION OF THE PREFERRED EMBODIMENTS

The following is a description of embodiments of the present invention, with reference to the accompanying drawings.

1. General Principles

Before describing configurations of embodiments of the present invention, the following is a description of the principles to be applied with the present invention and the effects that can be obtained.

It is known that the deterioration of the element characteristics over the course of time ordinarily can be described by an exponential function. Thus, in the following description, the temporal change of the normalized luminance of a single electro-optical element is approximated by an exponential function L(t). This exponential function L(t) is given by:

$$L(t) = \exp(-K \cdot t) \quad (1)$$

where K represents an exponential coefficient and t represents time.

Figure 1:
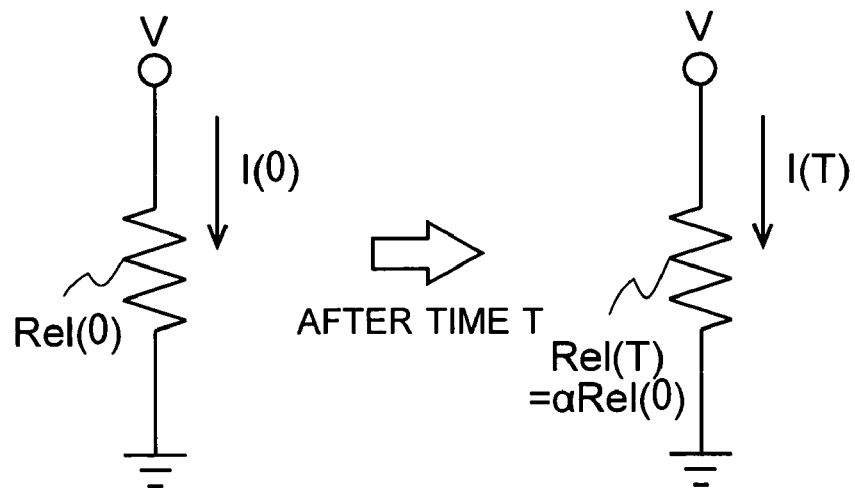
FIG. 1 is a circuit diagram of a single electro-optical element emitting light, illustrating the principle of a display element according to an embodiment of the present invention.

FIG. 1 is a circuit diagram of a single electro-optical element emitting light. When V is the voltage applied by the power source to the electro-optical element in the figure, Rel(0) is the resistance when the electro-optical element assumes a predetermined luminance, and I(0) is the current at that time, then the current at the time T can be expressed as I(T) and the resistance of the electro-optical element at the time (T) can be expressed as Rel(T). In accordance with Ohm's law, the relation between current, voltage and resistance can be given as:

$$\begin{aligned} V &= I(0) \cdot Rel(0) \\ &= I(T) \cdot Rel(T) \end{aligned} \quad (2)$$

Here, assuming that the resistance Rel(T) of the electro-optical element is α times the resistance Rel(0) of the electro-optical element at the time near the initial state without any emission history (in the following also referred to as "initial light emission stage"), then Rel(T) can be expressed as:

$$Rel(T) = \alpha \cdot Rel(0) \quad (3)$$

Moreover, the luminance of the electro-optical element and the current density are in a substantially proportional relation, so that when the exponential function L(t) of Equation (1) is taken as L1(t) and the exponential coefficient is taken to be K1, then L1(t) can be expressed as the equation of the normalized current I(t)/I(0), as shown by Equation (4):

$$\begin{aligned} L1(t) &= I(t)/I(0) \\ &= \exp(-K1 \cdot t) \end{aligned} \quad (4)$$

In accordance with Ohm's law and Equation (4), the value of α given in Equation (3) also can be expressed as the inverse of the normalized luminance, namely as follows:

$$\begin{aligned} \alpha &= Rel(T)/Rel(0) \\ &= (V/I(T))/(V/I(0)) \\ &= 1/(I/(T)/I(0)) \\ &= 1/LI(T) \end{aligned} \quad (5)$$

Moreover, Equation (2) can be formed into I(T)=V/Rel(T), I(0)=V/Rel(0), and Equation (4) can be formed into I(T)/I(0)=exp(−K1·T), from which the following Equation (6) can be derived:

$$(V/Rel(T))/(V/Rel(0)) = \exp(-K1 \cdot T) \quad (6)$$

Furthermore, from Equations (4) and (5) it follows that 1/α=exp(−K1·T), so that K1 can be expressed as:

$$K1 = (\ln \alpha)/T \quad (7)$$

Consequently, the standardized current I(t)/I(0) at a given time t can be expressed with Equations (4) and (7) as:

$$\begin{aligned} LI(t) &= I(t)/I(0) \\ &= \exp(-(\ln \alpha)/T \cdot t) \end{aligned} \quad (8)$$

Moreover, due to I(t)=V/Rel(t) and I(0)=V/Rel(0), Equation (8) can be expressed as (V/Rel(t))/(V/Rel(0))=exp(−(ln α)/T·t), so that due to Ohm's law, Equation (8) can also be expressed as the deterioration function Rel(t) of the resistance in the electro-optical element over time, as in Equation (9):

$$Rel(t) = Rel(0) \cdot \exp(-(\ln \alpha)/T \cdot t) \quad (9)$$

Figure 2:
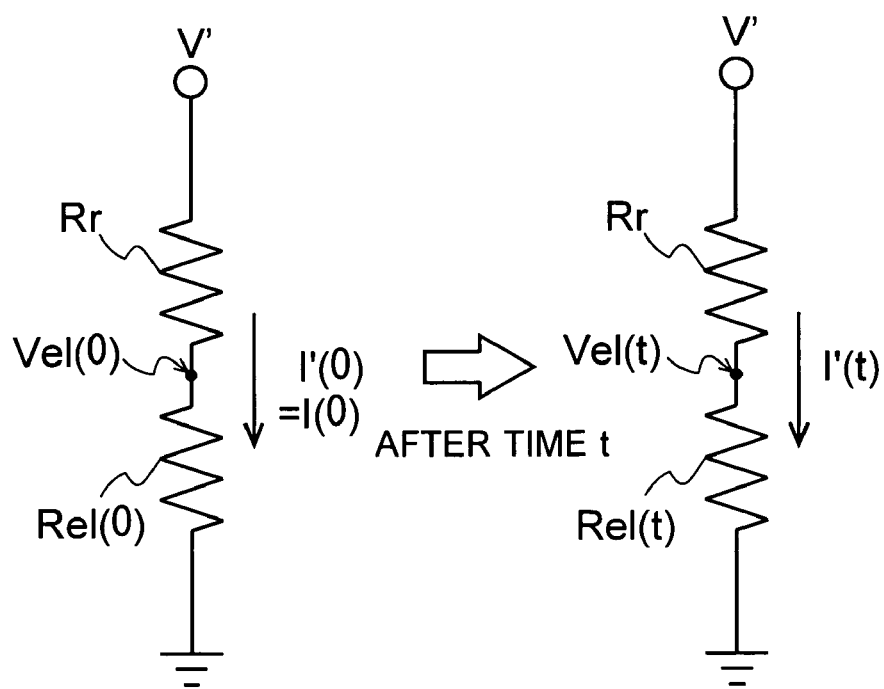
FIG. 2 is a circuit diagram of the elements when a resistance element is inserted in series with the electro-optical element, illustrating the principle of a display element according to this embodiment.

The following is an explanation of the case that a resistance element is connected in series to the electro-optical element. FIG. 2 is a circuit diagram of the elements when a resistance element is inserted in series with the electro-optical element of the circuit in FIG. 1. It should be noted that the deterioration characteristics of the electro-optical element are the same, irrespective of the resistance element that is connected. When Rel(0) is the resistance at the initial light emission stage of this electro-optical element, and Rr is the resistance (in the following also "insertion resistance") of the resistance element inserted in series into the electro-optical element (in the following also "inserted resistance element"), then a voltage V' can be determined such that the current I'(0) at the initial light emission stage of the electro-optical element becomes the same as the current I(0). That is to say, the voltage V' can be determined such that the emitted luminance of the electro-optical element shown in FIG. 2 becomes the same as the emitted luminance at the initial light emission stage of the electro-optical element when no resistance element is inserted (as shown in FIG. 1).

If Vel(0) is the voltage that is applied to the electro-optical element at the initial light emission stage and Vr(0) is the voltage that is applied to the inserted resistance element (inserted resistance Rr), then, in accordance with Ohm's law, the relation between current, voltage and resistance is:

$$\begin{aligned} V' &= Vel(0) + Vr(0) \\ &= I'(0) \cdot (Rr + Rel(0)) \\ &= I(0) \cdot (Rr + Rel(0)) \end{aligned} \quad (10)$$

According to Ohm's law, I(0) in Equation (10) can be expressed as I(0)=Vel(0)/Rel(0), so that when this is inserted in Equation (10), V' can be expressed as:

$$V' = Vel(0) \cdot (Rr + Rel(0))/Rel(0) \quad (11)$$

Here, when $\beta$ is the resistance ratio between the inserted resistance Rr and the resistance Rel(0) at the initial light emission stage of the electro-optical element (that is, the proportion of the inserted resistance Rr to the resistance Rel(0)), then $\beta$ can be expressed by the following Equation (12), by substituting $\beta$ with the voltage division ratio:

$$\begin{aligned}\beta &= Rr/Rel(0) \quad (12)\\ &= (Vr(0)/I'(0))/(Vel(0)/I'(0))\\ &= Vr(0)/Vel(0)\end{aligned}$$

When Equation (11) is written using $\beta$ as given in Equation (12), then V' can be expressed as:

$$V' = Vel(0) \cdot (\beta + 1) \quad (13)$$

Here, when R(t) is the sum of the resistance Rel(t) of the electro-optical element at the time t and the inserted resistance Rr, and Equations (9) and (12) are substituted with R(t), then R(t) can be written as:

$$\begin{aligned}R(t) &= Rel(t) + Rr \quad (14)\\ &= Rel(0) \cdot \exp((\ln \alpha)/T \cdot t) + \beta \cdot Rel(0)\\ &= [\exp((\ln \alpha)/T \cdot t) + \beta] \cdot Rel(0)\end{aligned}$$

Similarly, with Ohm's law and Equations (13) and (14), also the current I'(t) at the time t can be expressed as:

$$\begin{aligned}I'(t) &= V'/R(t) \quad (15)\\ &= Vel(0)/Rel(0) \cdot (\beta+1)/[\exp((\ln \alpha)/T \cdot t) + \beta]\\ &= I(0) \cdot (\beta+1)/[\exp((\ln \alpha)/T \cdot t) + \beta]\end{aligned}$$

Furthermore, from Equation (15), the temporal luminance change of the electro-optical element when a resistance element is inserted in series, that is, the current change I'(t)/I(0) can be expressed as:

$$I'(t)/I(0) = (\beta+1)/[\exp((\ln \alpha)/T \cdot t) + \beta] \quad (16)$$

As for the time in which the current flowing through the electro-optical element when the resistance element is not inserted (as shown in FIG. 1) becomes the same as the current flowing through the electro-optical element when the resistance element is inserted in series (as shown in FIG. 2), when T is the above-noted time when no resistance element is inserted then that time when a resistance element is inserted can be expressed as X times T, that is, XT. It follows that I'(XT)/I(0)=I(T)/I(0). When Equation (8) and Equation (16) are inserted into this equation, the following Equation (17) can be derived:

$$(\beta+1)/[\exp((\ln \alpha)/T \cdot t) + \beta] = \exp(-(\ln \alpha)/T \cdot T)$$

And solving for $\beta$ yields:

$$\beta = (\alpha^X - \alpha)/(\alpha - 1) \quad (18)$$

According to this Equation (18), when T is the time in which the electro-optical element deteriorates and a predetermined luminance becomes the luminance L, then the value of $\beta$ that prolongs this time T by a factor X (that is, the ratio Vr/Vel between the voltage Vel that is applied across the electro-optical element when the emitted luminance of the electro-optical element is a predetermined luminance to the voltage Vr that is applied across the inserted resistance element at that time) can be determined by determining the rate of increase of the voltage Vel of the electro-optical element after the time T (that is, the inverse of the normalized luminance after the time T). Conversely, by determining the value of a and further determining the value of $\beta$ through determining the value of the voltage Vr, it is possible to know that the time T from a predetermined luminance to the luminance L is prolonged by the factor X.

It should be noted that although it has not been mentioned in the foregoing principal explanations, in practice, there may be deviations in the value derived from the above-noted exponential function due to the influence of other resistance elements, such as wiring, due to variations in the internal structure of the electro-optical element, and due to deterioration over time of the switching elements and the like. For example, the temporal change model of the luminance of the electro-optical element approximated by Equation (1) is a model of the initial light emission stage, so that considering the results of actual measurements described later, it appears that the intermediate light emission period (for example, near a time in which the predetermined luminance has been reduced by half) requires a polynomial approximation equation in which corrective terms have been added to Equation (1). However, regardless of these deviations, the speed of the temporal change of the luminance of the electro-optical element is slowed down by the inserted resistance, as shown in the description of the basic principle above, and the effect of prolonging the display lifetime can be obtained, so that the description of this polynomial equation has been omitted.

In the display element according to an embodiment of the present invention (here, this is a pixel circuit constituting a pixel) as explained below, the conductance of the current control TFT connected in series to the electro-optical element included in the display element is adjusted without using the above-described inserted resistance element. More specifically, the divisional voltage Vr is adjusted by regulating the gate width of the current control TFT or regulating the voltage of the data signal. The display element is thus provided with a longer display lifetime. The following is a description of a display element in which an organic EL element is taken as the electro-optical element included in the display element according to the present embodiment, in which TFT elements are taken as the switching elements, and in which the conductance of the current control TFT connected in series with the organic EL element is adjusted, as well as of a display device including such a display element.

2. Configuration of Display Element and Display Device

Figure 3:
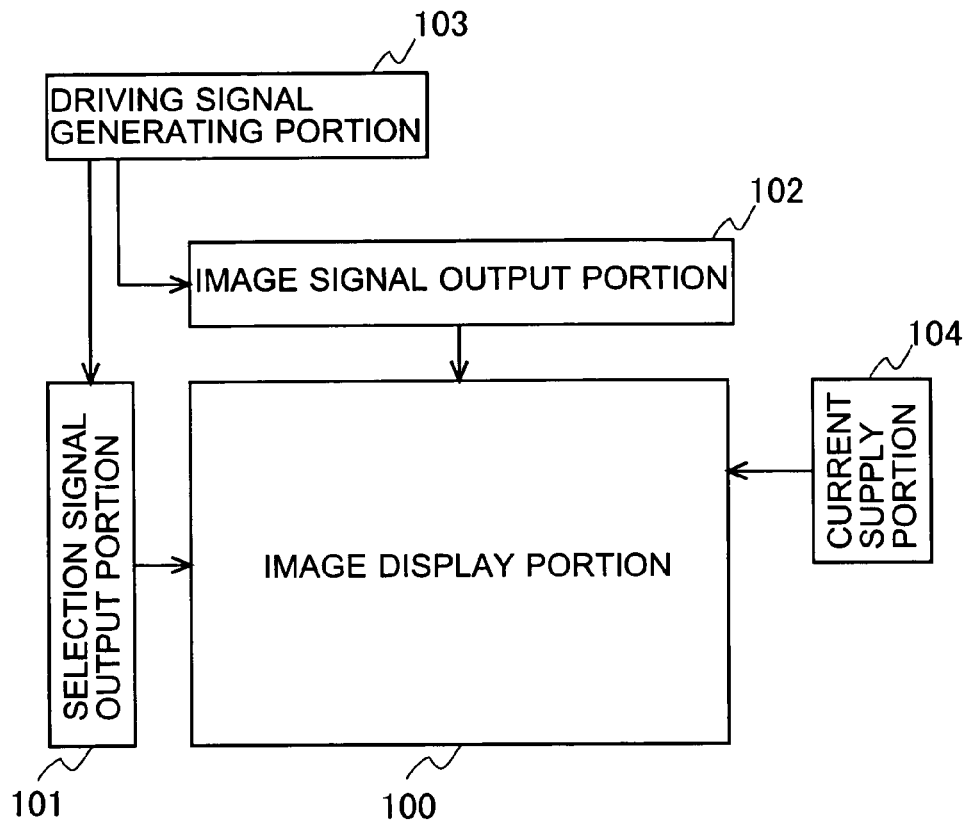
FIG. 3 is a block diagram showing the configuration of a display device according to this embodiment.

FIG. 3 is a block diagram showing the configuration of a display device according to an embodiment of the present invention. This display device includes an image display portion 100, a selection signal output portion 101, a data signal output portion 102, a driving signal generating portion 103, and a current supply portion 104. The image display portion 100 is configured by arranging a plurality of display elements in an m×n matrix. The selection signal output portion (gate driver circuit) 101 is connected to a plurality of scanning signal lines linked to the signal line electrodes of the display elements, and outputs scanning signals having a predetermined period to these scanning signal lines. The data signal output portion (source driver circuit) 102 is connected to a plurality of data signal lines linked to the data signal line electrodes of the display elements, and outputs data signals for controlling the emission or non-emission of the organic EL elements. The driving signal generating portion 103 outputs predetermined control signals for generating the scanning signals and the data signals to the selection signal output portion 101 and the data signal output portion 102. The current supply portion 104 is connected to a plurality of power source lines that are linked to the power source line electrodes of the display elements, and serves as a driving power source for supplying a driving current to the light emitting elements.

Figure 4:
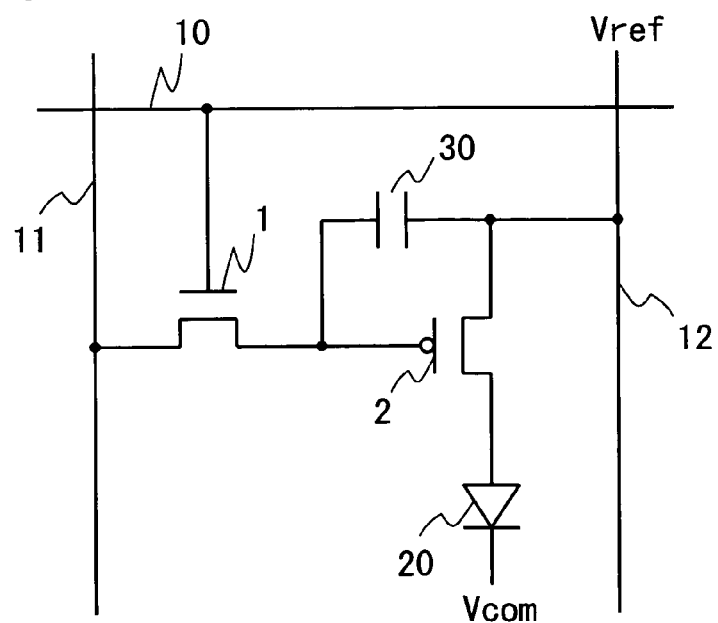
FIG. 4 is a diagram showing an equivalent circuit of the display element of this embodiment.

The following is a description of the configuration of the display elements included in the pixel display portion 100. FIG. 4 is a diagram showing an equivalent circuit of a display element in accordance with an embodiment of the present invention. This display element includes an organic EL element 20, which is an electro-optical element, a power source line electrode 12, which supplies current from the driving power source Vref (the current supply portion 104), a scanning signal line electrode 10, which is connected to the selection signal output portion (gate driver circuit) 101, a data signal line electrode 11, which is connected to the data signal output portion (source driver circuit) 102, a common electrode Vcom, an auxiliary capacitance 30, a current control TFT 2, which is a p-channel TFT for controlling the current flowing through the organic EL element 20, and a data voltage control TFT 1, which is an n-channel TFT for controlling the timing at which current flows through the organic EL element 20.

The silicon films of the data voltage control TFT 1 and the current control TFT 2 may be made of amorphous silicon, polycrystalline silicon, or of organic films having a conductance that is different from that of silicon films, but here the above-mentioned CG silicon is used, which has a greater crystallinity than amorphous or polycrystalline silicon and with which a greater current can be caused to flow through the organic EL element (that is, with which an even higher display luminance can be attained, because the upper limit of the emitted luminance becomes higher). It should be noted that for these silicon films, it is also possible to use silicon films with which even greater currents can be caused to flow than with CG silicon, such as monocrystalline silicon. Moreover, in this display element, a p-channel TFT is used as the current control TFT 2, but known pixel circuit configurations using an n-channel TFT are also possible.

As shown in FIG. 4, the power source line electrode 12 is connected to the source terminal of the current control TFT 2 and to one terminal of the auxiliary capacitance 30, whereas the other terminal of the auxiliary capacitance 30 is connected to the gate terminal of the current control TFT 2 and to the drain terminal of the data voltage control TFT 1. Moreover, the source terminal of the data voltage control TFT 1 is connected to the data signal line electrode 11, and the gate terminal of the data voltage control TFT 1 is connected to the scanning signal line electrode 10. The anode of the organic EL element 20 is connected to the drain terminal of the current control TFT 2, and the cathode of the organic EL element 20 is connected to the common electrode Vcom.

With the constant voltage control method, a data signal voltage is applied to the data signal line electrode 11 during the period in which the data voltage control TFT 1 is selected by the scanning signal applied to the scanning signal line electrode 10, and thus a voltage corresponding to this data signal voltage is held by the auxiliary capacitance 30. After that, during the period in which the data voltage control TFT 1 is not selected, the conductance of the current control TFT 2 is controlled in accordance with the voltage that is held by the auxiliary capacitance 30. Thus, a predetermined current flows through the organic EL element 20 connected in series to the current control TFT 2, thereby controlling the light emission amount.

In the above-described configuration, no inserted resistance element is connected in series with the electro-optical element, as in the above-described conventional display element, and by controlling the conductance of the current control TFT 2, that current control TFT 2 is caused to function as the resistance element (instead of the inserted resistance element). It should be noted, however, that in analog gray scale control configurations in which the source-drain current of the current control TFT 2 is controlled by analog quantities, variations of the gray levels due to the element characteristics of the TFT element as disclosed in the afore-mentioned JP 2001-272930A may become large. Therefore, an analog gray scale control method can be employed as the configuration of the present embodiment, but for the above-noted reasons, this is not necessarily preferable. In the present embodiment, a digital gray scale control method is employed, in which the organic EL element 20 is controlled by a binary data signal voltage with an emitting state of a predetermined bright luminance and a non-emitting state of a predetermined dark luminance, and gray levels are expressed by controlling the emission time of the organic EL element 20.

Figure 5:
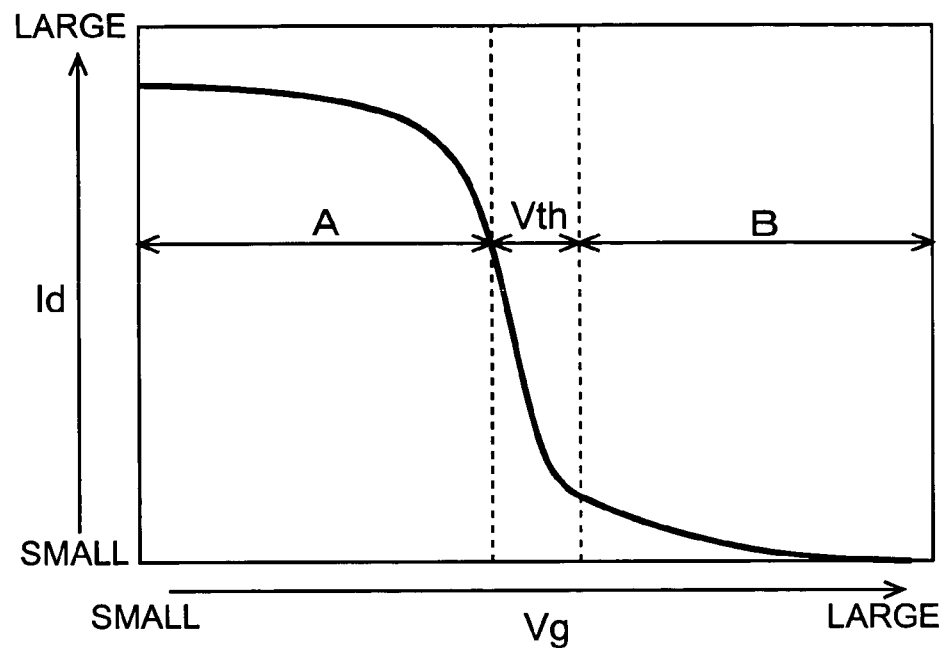
FIG. 5 is a diagram illustrating the relation between the voltage Vg and the current Id when a current of the value Id flows between source and drain while a voltage of the value Vg is applied to the gate of the current control TFT in this embodiment.

The following is a description of this binary data signal voltage. FIG. 5 is a diagram illustrating the relation between the voltage Vg and the current Id when a current of the value Id flows between source and drain while a voltage of the value Vg is applied to the gate of the current control TFT 2. In FIG. 5, the range of the voltages Vg in which the organic EL element 20 emits light is indicated as "A" and the range of the voltages Vg in which the organic EL element 20 does not emit light is indicated as "B," and the range of the voltages Vg in the border region between the emitting state and the non-emitting state is indicated as the threshold voltages Vth.

As can be seen in FIG. 5, with the voltages Vg that can be distinguished into emitting state and non-emitting state, the voltages Vg of any region except for the threshold voltage Vth can be taken as the reference value of the data signal voltage. Needless to say, when the contrast ratio necessary for display is for example 1000 or greater, then it is preferable that a voltage Vg is taken as the reference value with which the absolute value of the ratio of the current during emission to the current during non-emission becomes at least $10^3$.

It should be noted that the power source line electrode 12 is connected to the driving power source Vref (current supply portion 104) serving as the constant voltage source circuit, so that this power source line electrode 12 applies a constant voltage that is sufficient for letting the organic EL element 20 emit light and that is sufficient for sustaining an emitting state at the set luminance to the organic EL element 20 and to the current control TFT 2 connected in series with the organic EL element 20.

Here, the effect of prolonging the display lifetime of the organic EL element 20 is described in simple terms, so that it is explained for fixed conditions as below. That is to say, it is assumed that a constant voltage is applied to the series circuit formed by the current control TFT 2 and the organic EL element 20, and that the organic EL element 20 is constantly emitting light.

Under these conditions, the voltage Vg that is applied to the gate of the current control TFT 2 falls into the range "A" shown in FIG. 5, so that the conductance of the current control TFT 2 is held at a high state by the auxiliary capacitance 30. That is to say, under these conditions, a scanning signal that puts the data voltage control TFT 1 into the selected state is applied to the scanning signal line electrode 10, and a data signal of a voltage that is necessary and sufficient for keeping the current control TFT 2 in the high-conductance state is applied to the data signal line electrode 11. Consequently, the resistance components and the capacitance components of the scanning signal line electrode 10, the data signal line electrode 11, the data voltage control TFT 1 and the auxiliary capacitance 30 that are part of the display element, as well as the capacitance components of the current control TFT 2 and the organic EL element 20 can be ignored. As a result, the display element can be described as a simple series circuit of the conductive resistance Rr of the current control TFT 2 when the organic EL element 20 is emitting light and the resistance Rel of the organic El element 20.

Figure 6:
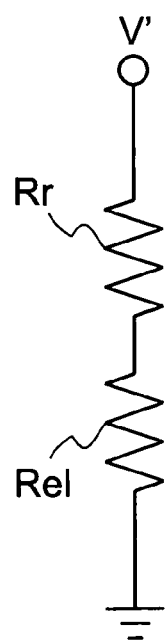
FIG. 6 is a diagram showing an equivalent circuit of a display element according to this embodiment represented as a series circuit.

FIG. 6 is a diagram showing an equivalent circuit of a display element represented as this series circuit. As becomes clear from referring to this FIG. 6, if the conductive resistance Rr of the current control TFT 2 is set to a predetermined value, then the divisional voltage applied to the organic EL element 20 can be set to the desired value without serially inserting a resistance element as in the above-described conventional display element.

To achieve this, the conductive resistance Rr of the current control TFT 2 can be controlled to the desired value by appropriately setting the data signal voltage that is applied to the gate of the current control TFT 2, that is, the voltage Vg. Thus, the display lifetime of the organic EL element 20 can be prolonged by setting the divisional voltage applied to the organic EL element 20 to the desired value without inserting a resistance element in series. Needless to say, it is preferable that the voltage Vg is set to a value at which the absolute value of the ratio of the current flowing through the organic EL element during emission to the current flowing during non-emission is at least $10^3$, as noted above.

The conductive resistance Rr of the current control TFT 2 also can be set to the desired value by changing the gate width or the gate length of the current control TFT 2, without setting the data signal voltage to an appropriate value as above. In general, when the gate width is decreased or the gate length is increased, the conductance becomes lower and the resistance between source and drain increases. Thus, by appropriately designing the structure (for example the gate width) of the current control TFT 2, the conductive resistance Rr of the current control TFT 2 can be set to the desired value. Thus, the display lifetime of the organic EL element 20 can be prolonged by setting the divisional voltage applied to the organic EL element 20 to the desired value, without inserting a resistance element in series. The following is a description of the structure of this current control TFT 2.

Figure 7:
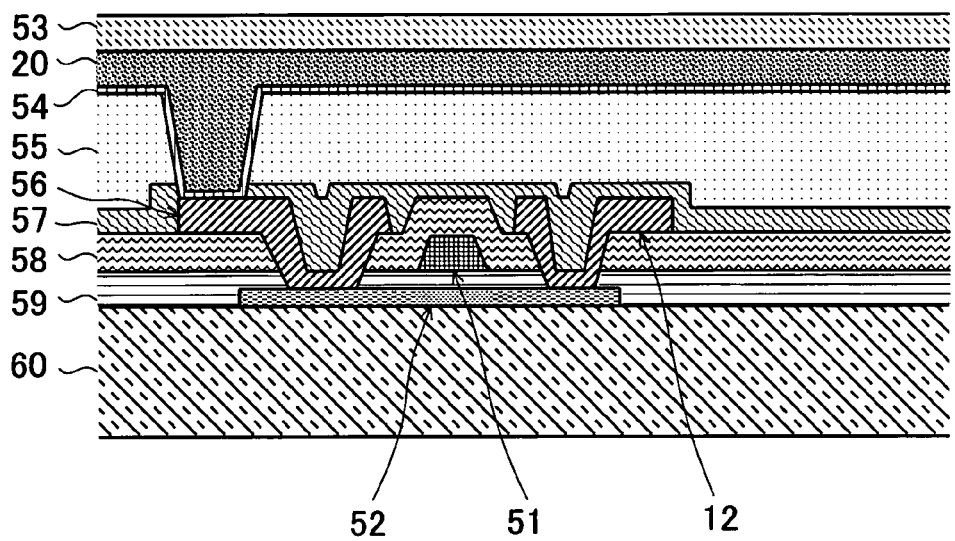
FIG. 7 is a cross-sectional view showing an example of the structure of the current control TFT in this embodiment.

FIG. 7 is a cross-sectional view showing an example of the structure of the current control TFT 2 included in the display element. As shown in FIG. 7, a CG silicon thin film 52 serving as the active layer is formed on a glass substrate 60, a gate insulating film 59 is formed on top of that, and a gate electrode 51 and an inter-layer insulating film 58 are formed on the gate insulating film 59. After that, two contact portions (described later) exposing the CG silicon thin film 52 are opened, and a wiring layer 56 and a power source line electrode 12 are formed in these contact portions. Moreover, after a passivation film 57 for passivation and a flattening film 55 for flattening the surface are formed on top of that, a contact portion exposing the wiring layer 56 is opened. On top of this, a transparent electrode film 54 made of ITO (indium tin oxide) is formed. This transparent electrode film 54 serves as an anode electrode of the organic EL element 20. Furthermore, after the organic EL element 20 has been formed by applying an organic material serving as the electroluminescent material on top of the transparent electrode film 54, a metal conductive film 53 serving as the common electrode Vcom is formed. This metal conductive film 53 serves as the cathode of the organic EL element 20.

It should be noted that (the organic EL element 20 of) the display element emits light towards the direction of the glass substrate 60 on which the thin film transistor including the CG silicon thin film 52 is formed. Such a structure is referred to as "bottom emission structure." On the other hand, by switching the transparent electrode film 54 serving as the anode electrode and the metal conductive layer 53 serving as the cathode electrode, it is also possible to cause emission in the opposite direction. This structure is referred to as "top emission structure."

Figure 8:
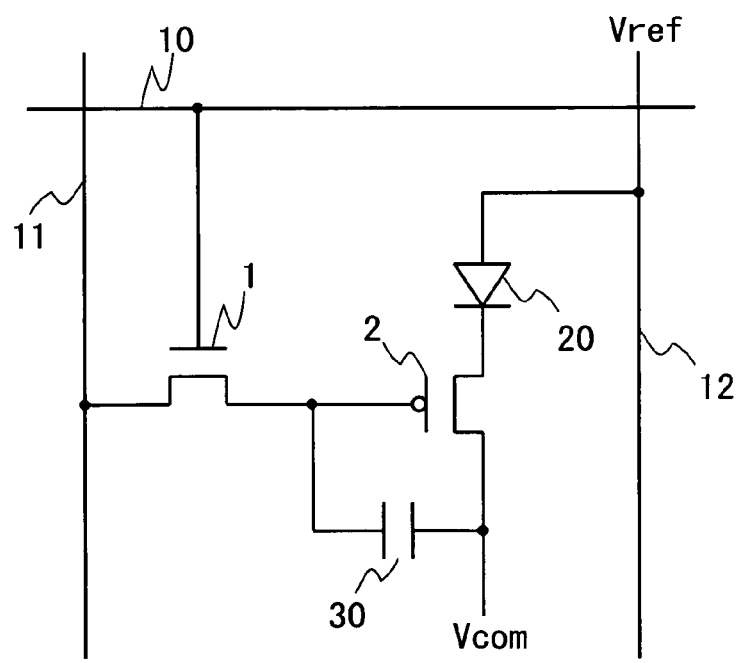
FIG. 8 is a diagram showing an equivalent circuit of a display element according to this embodiment realizing a top emission structure.

FIG. 8 is a diagram showing an equivalent circuit of a display element realizing a top emission structure. As shown in FIG. 8, this top emission structure is different from the equivalent circuit of the display element shown in FIG. 4 in that the positional relation of the organic EL element 20 serving as the electro-optical element and the current control TFT 2 is reversed, and the anode of the organic EL element 20 is directly connected to the power source line electrode 12 without passing through the current control TFT 2. This structure has the advantage that the numerical aperture can be made larger, because in this structure the light does not pass through the glass substrate on which the TFT is formed, but it has the disadvantage that it is difficult to form the organic film on the metal conductive layer, so that ordinarily, the bottom emission structure is preferred. However, with the configuration of the display element of this embodiment, the exact same effect can also be displayed with the top emission structure, so that the display device (display element) according to the present embodiment may also have a top emission structure.

Figure 9:
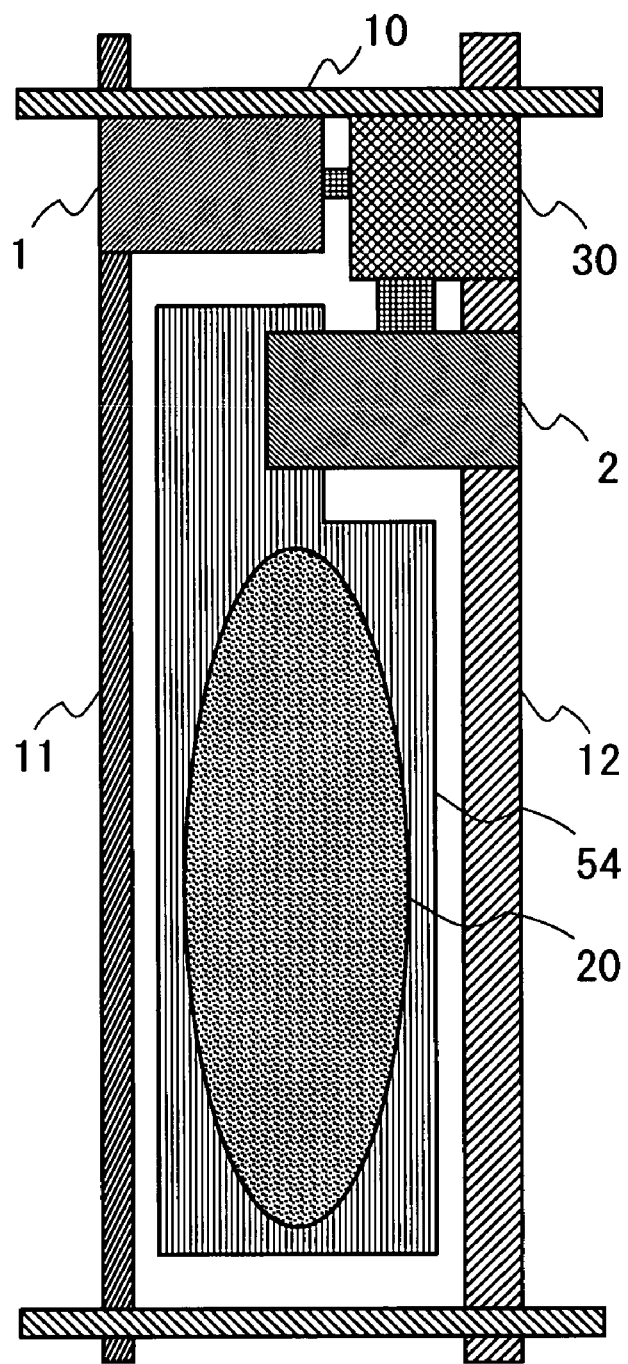
FIG. 9 is a top view showing the schematic structure of the display element according to this embodiment including a current control TFT.

FIG. 9 is a top view showing the schematic structure of the display element including this current control TFT 2. This display element includes the structural elements shown in FIG. 4, namely the organic EL element 20, the power source line electrode 12, the scanning signal line electrode 10, the data signal line electrode 11, the auxiliary capacitance 30, the current control TFT 2, and the data voltage control TFT 1. Furthermore, the display element is provided with the transparent electrode film 54 made of ITO formed on the lower surface of the organic EL element 20. It should be noted that, that for illustrative reasons, the metal conductive layer 53 shown in FIG. 7 has been omitted in FIG. 9.

Figure 10:
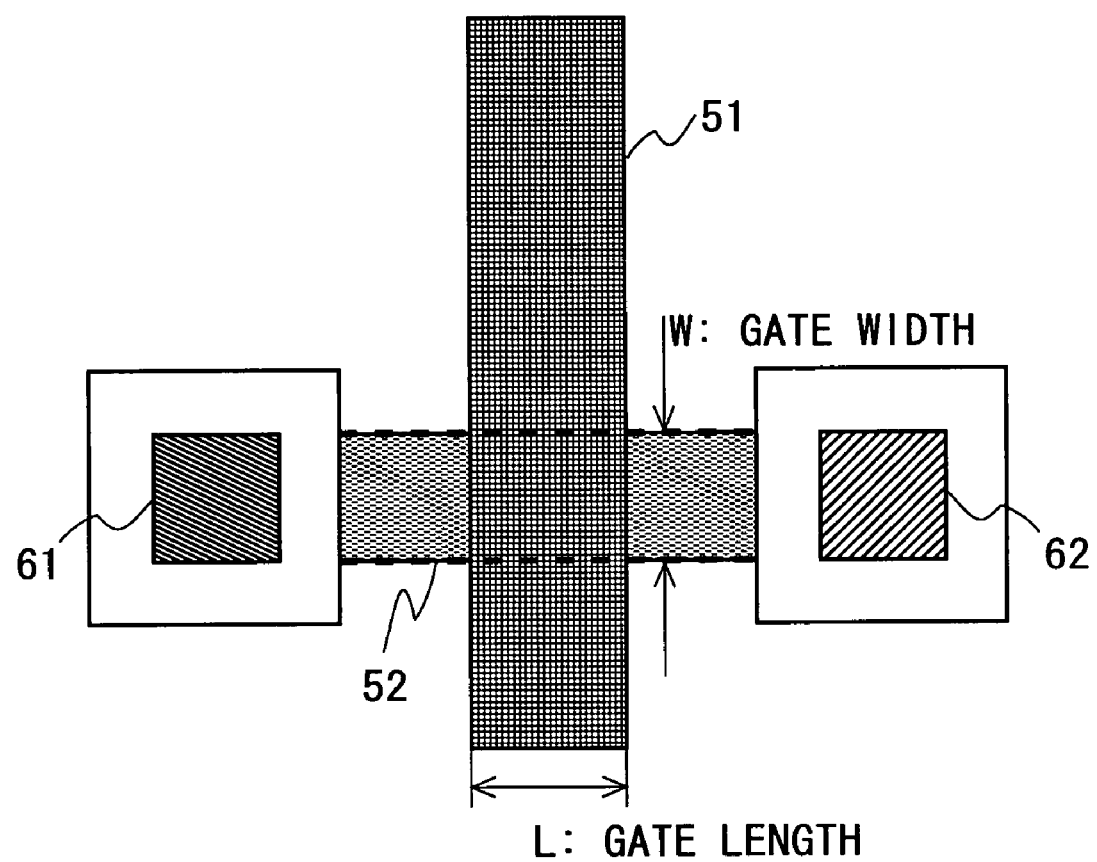
FIG. 10 is a top view showing the schematic structure of the current control TFT in this embodiment.

FIG. 10 is a top view showing the schematic structure of the current control TFT 2. As shown in FIG. 10, one side of the CG silicon thin film 52 is connected via a first contact portion 61 to the transparent conductive film 54, and the other side is connected via a second contact portion 62 to the power source line electrode 12. Moreover, the gate electrode 51 intersects perpendicularly with the CG silicon thin film 52, and the length of the gate electrode 51 along the longitudinal direction of the CG silicon thin film 52 is shown as the gate length L, whereas the length of the CG silicon thin film 52 along the longitudinal direction of the gate electrode 51 is shown as the gate width W. Here, if the gate width W is made small or the gate length L is made large, then the conductivity is lowered, so that the display lifetime of the organic EL element 20 can be relatively prolonged. The following is a more detailed explanation of this.

The value of the internal resistance during the initial light emission stage at a predetermined luminance of the organic EL element included in the display element fluctuates greatly depending on the light emission surface area and the internal structure, so that, even though there are no particular limitations, the value of the internal resistance is ordinarily 100 Ω to 20 MΩ. For example, this internal resistance at a pixel density of 100 PPI (pixel per inch) is 1 MΩ to 10 MΩ. Ordinarily, the value of the internal resistance of the organic EL element can be calculated from the current density flowing through this internal portion, the luminance characteristics, and the current density—voltage characteristics. Moreover, it is well known that the internal resistance changes depending on the voltage applied to the (two terminals of the) organic EL element. Although the voltage applied to the organic EL element when letting the element emit light (referred to below as "EL voltage during emission") depends on the element structure, it is ordinarily about 2 V to about 10 V.

Moreover, although the withstand voltage of the TFT elements made of CG silicon included in this display element depends on the gate length and the like, it is maximally about 16 V. Thus, the upper limit of the voltage that can be applied between source and drain of the current control TFT 2 during emission is 16 V. Moreover, the divisional voltage applied to the current control TFT 2 when the current control TFT 2 is OFF, that is, when the organic EL element 20 is in a non-emitting state, is equivalent to the voltage obtained by subtracting the divisional voltage applied to the organic EL element 20 in the non-emitting state (referred to below as "EL voltage during non-emission") from the power source voltage. This EL voltage during non-emission differs depending on the material constituting the organic EL element 20 and the current flowing through the element, but it is roughly in the order of 0 V to 2 V. Thus, considering the emitting state and the non-emitting state of the organic EL element 20, the upper limit of the overall voltage V' that is the sum of the voltage between source and drain of the current control TFT 2 and the EL voltage Vel is 16 V. It should be noted that also with regard to power consumption, an upper limit of the voltage V' of about 16V is appropriate.

Here, the equivalent circuit of the display element according to the above-described embodiment shown in FIG. 6 can be thought of as being the same as that of the conventional display element shown in FIG. 2, in which a resistance element is inserted in series, so that the voltage Vr applied to the inserted resistance element that is inserted in the conventional display element can be regarded as the source-drain voltage of the current control TFT 2. When Vel is the voltage applied to the organic EL element during emission, Vr is the source-drain voltage of the current control TFT 2 during emission and β=Vr/Vel, then the minimum of the voltage Vel is 2V, which is the minimum voltage for letting the organic EL element 20 emit light, so that the following Expression (19) can be derived from Equation (13):

$$16 \geq 2(\beta+1) \quad (19)$$

From Expression (19), it follows that β≦7, that is, the upper limit of β is 7.

Moreover, as noted above, the display lifetime of the EL element is longer when an inserted resistance element (inserted resistance Rr) is connected in series with the EL element than in display elements to which no resistance element is connected (inserted resistance Rr=0), so that it can be assumed that β≦0. The actual lower limit for β is described below.

Here, it is preferable that the withstand voltage of the current control TFT 2 is as large as possible, but as noted above, the TFT withstand voltage of CG silicon depends on the gate length and the like. Generally, elements with a withstand voltage of maximally 8 V are used for the current control TFT 2. In this case, when the minimum voltage for letting the organic EL element 20 emit light is set to 2 V, then it follows similarly from Equation (13) that β≦3.

Next, using the equivalent circuit shown in FIG. 6 as a model, it is explained how the display lifetime can be prolonged by changing the (divided) voltage applied to the current control TFT 2 included in the display element. Here, the voltage applied to the current control TFT 2 is determined by the conductive resistance of the element, and the gate width W of the current control TFT 2 being 4 μm is regarded as Condition A, whereas the gate width W of the current control TFT 2 being 30 μm is regarded as Condition B. Moreover, for both Condition A and Condition B, the voltage applied to the gate of the data voltage control TFT 1 is set to 16 V, the voltage applied to the gate of the current control TFT 2 is set to 2 V, and the voltage from the driving power source is set to 9 V. Furthermore, in order to let the luminance at the initial light emission stage of the organic EL element 20 is the same for the Condition A and for the Condition B, the voltage applied from the driving power source is adjusted such that the current flowing through the current control TFT 2 is the same for the Condition A and the Condition B. In this case, the voltage of the common electrode Vcom becomes 4.70 V for Condition A and 5.02 V for Condition B. Moreover, the conductive resistance Rr between source and drain of the current control TFT 2 becomes about 300 kΩ for Condition A and about 5 kΩ for Condition B.

From the above, the voltage V' of the overall equivalent circuit shown in FIG. 6 becomes the voltage obtained by subtracting the voltage of the common electrode Vcom from the voltage of the driving power source, so that this voltage V' becomes 4.30 V for the Condition A and 3.98 for the Condition B. Moreover, even though it depends on the measurement environment, the resistance value of the wiring resistance and the like of the display element takes on a very small value of about 1/2000 of the internal resistance of the organic EL element 20, so that this resistance may be substantially ignored. Consequently, the ratio β (=Vr/Vel) of the divisional voltage Vr applied to the current control TFT 2 to the divisional voltage Vel applied to the organic EL element 20 becomes 0.131 for the Condition A and 0.002 for the Condition B.

Figure 11:
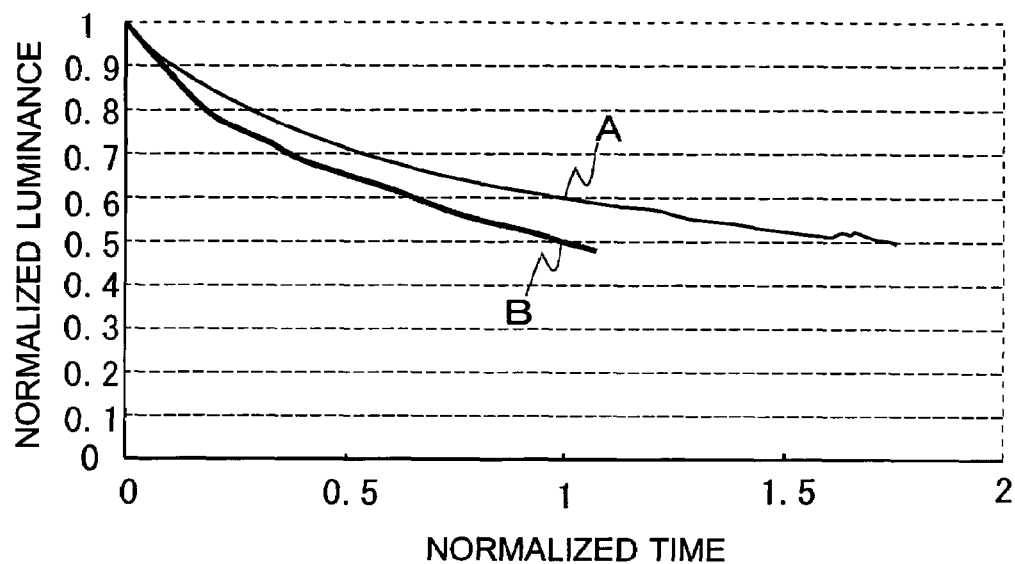
FIG. 11 is a graph showing the temporal change of the normalized emitted luminance of the organic EL element according to this embodiment under the Conditions A and B.
Figure 12:
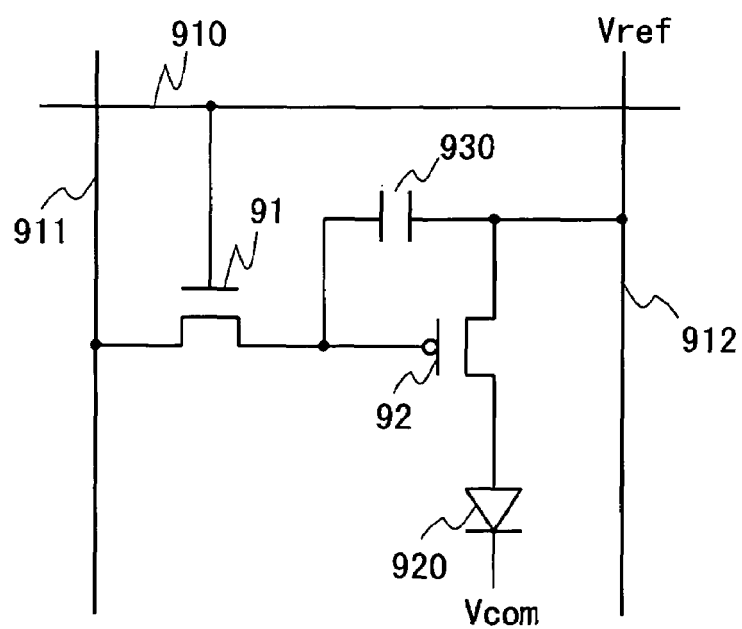
FIG. 12 is a diagram showing an equivalent circuit of a display element according to a conventional example.
Figure 13:
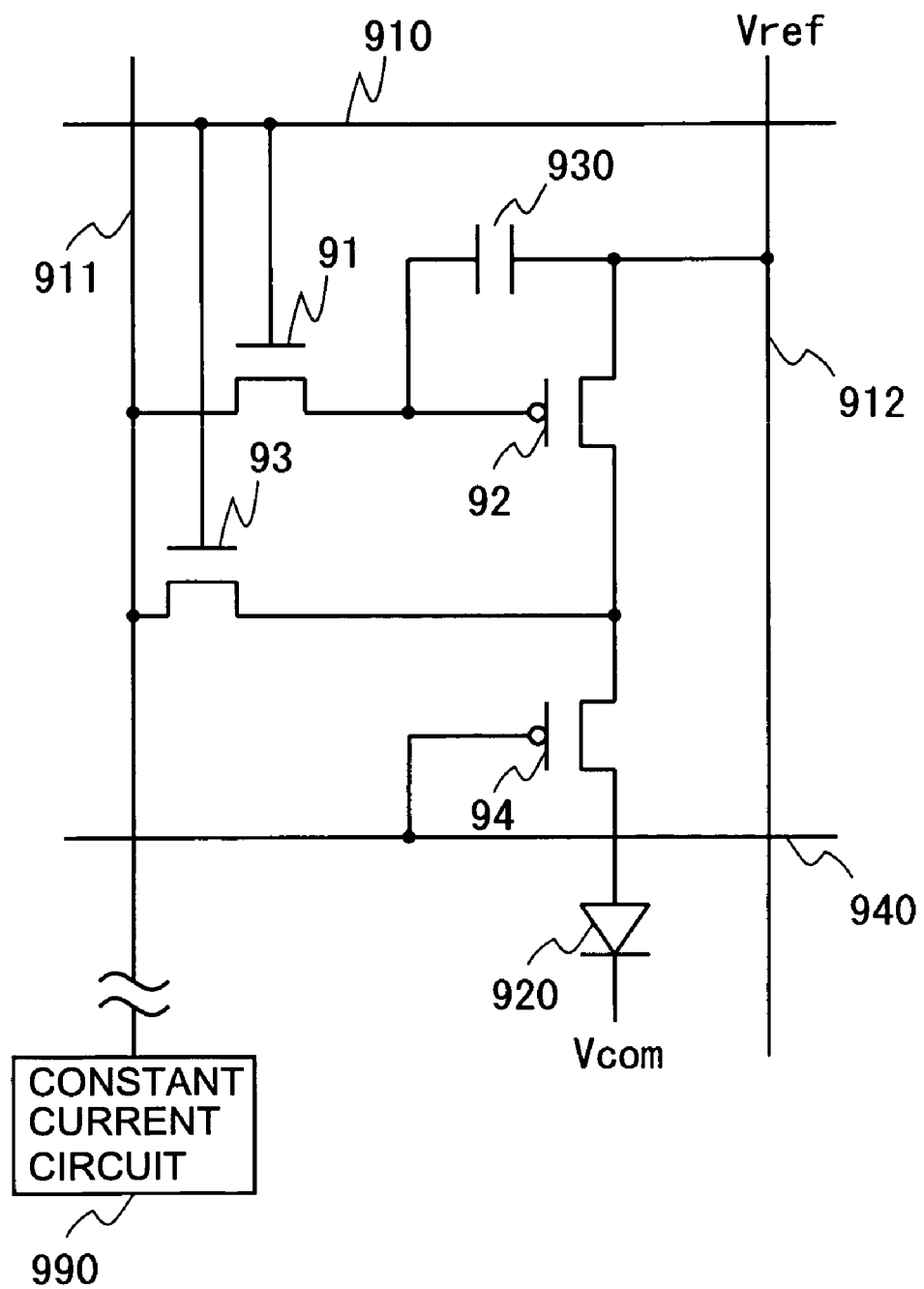
FIG. 13 is a diagram showing an equivalent circuit of a conventional example of a display element according to the constant current control method.
Figure 14:
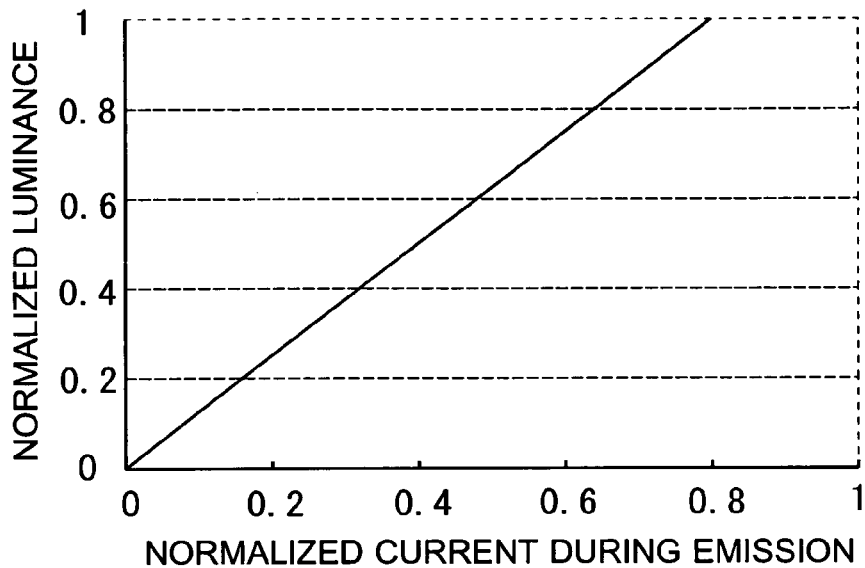
FIG. 14 shows the relation between the emitted luminance of an organic EL element according to a conventional example and the current flowing at the time of emission.
Figure 15:
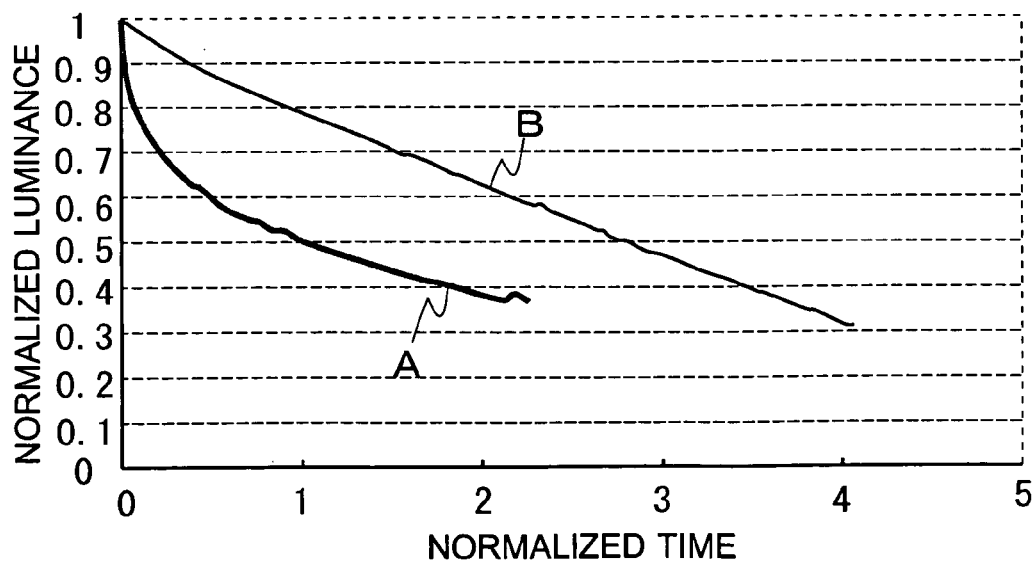
FIG. 15 is a diagram illustrating the decrease in emitted luminance over the course of time in conventional organic EL elements with the constant voltage control method and the constant current control method.
Figure 16:
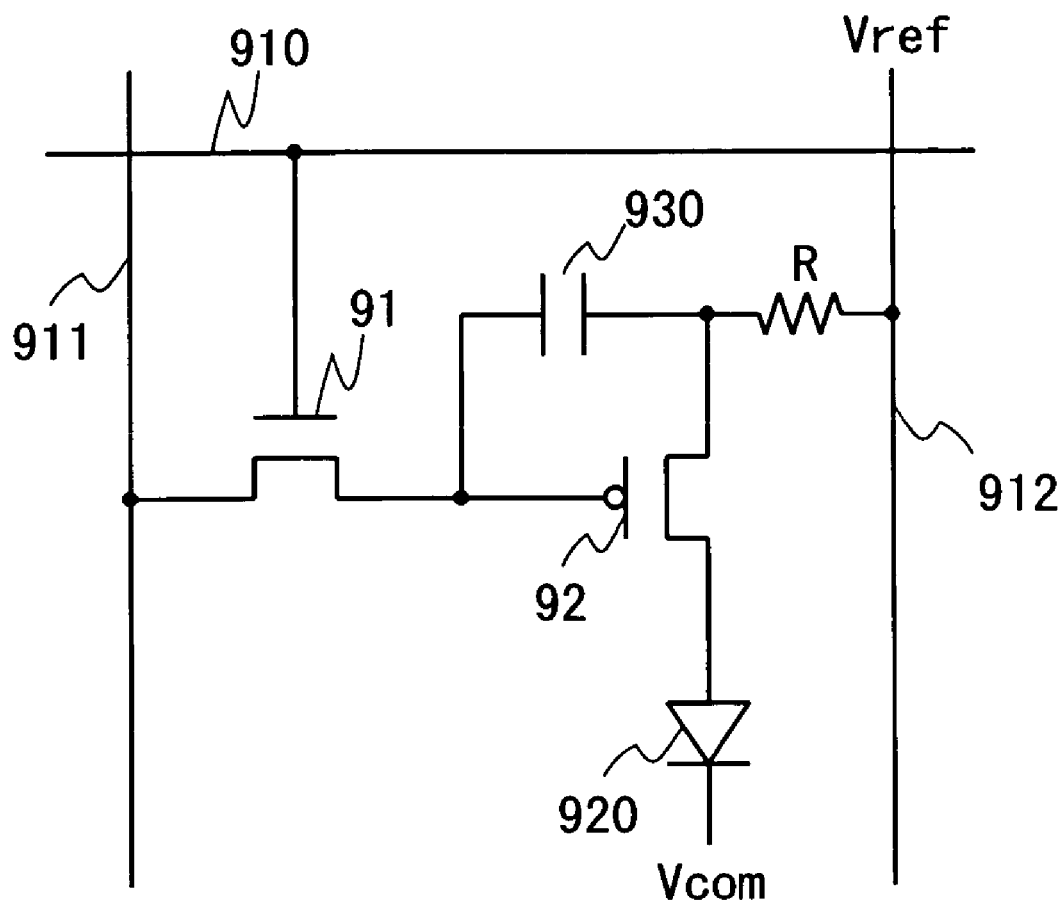
FIG. 16 is a diagram showing an equivalent circuit of a conventional display element, in which an organic EL element is connected in series with a resistance element.

FIG. 11 is a graph showing the temporal change of the normalized emitted luminance of the organic EL element 20 under the Conditions A and B. FIG. 11 shows the relation between time and emitted luminance for the Conditions A and B, marking the normalized emitted luminance of the organic EL element 20 on the vertical axis, and the normalized time on the horizontal axis. For the normalized time, the time after which the normalized luminance for the Condition B becomes 0.5 is taken as 1. As noted above, under the Condition B, β is substantially zero, so that the conductive resistance Rr of the current control TFT 2 under Condition B can be regarded as zero, and the voltage from the driving power source (voltage V') can be regarded as being entirely applied to the organic EL element 20. Focusing in FIG. 11 on the time until the emitted luminance decreases to a predetermined value, for example the time that passes until the normalized luminance becomes 0.9, it can be seen that the time that passes until the emitted luminance decreases to a predetermined value is under the Condition A prolonged by a factor of about 1.15 compared to the time under the Condition B. Moreover, based on the value of β in that case, this time is about 1.13 times longer for Condition A than for Condition B when determined with Equation (18). Conversely, the β determined with Equation (18) becomes 0.159, which is close to the value determined from the above measured values.

Moreover, the time that passes until the normalized luminance becomes 0.5, that is, the display lifetime of the organic EL element 20 is prolonged for Condition A by a factor of 1.76 over the time for Condition B. This value is about 1.09 times larger than the ratio of the time for Condition A to the time for Condition B as determined from Equation (18) based on β. The reason for this is that theoretically the deterioration speed of the element characteristics due to the passage of time have been approximated by an exponential function, but in actuality, it seems that the deterioration speed of the element characteristics decreases over time and becomes lower than the deterioration speed at the initial stage. Consequently, in order to make a more accurate theoretical prediction of the display lifetime, the deterioration function of the element characteristics may be corrected by considering this lowering of the deterioration speed over time.

As can be seen from the above, if β is equivalent to substantially zero, that is, when β=0.002 in the Condition B, then the conductive resistance Rr of the current control TFT 2 can be regarded as substantially zero compared to the resistance Rel of the organic EL element, and the voltage from the driving power source is applied almost entirely to the organic EL element 20, so that almost no effect of prolonging the display lifetime can be expected. On the other hand, if β takes on a value near 0.1, that is, if β=0.131 as under Condition A, then an actual effect of prolonging the display lifetime can be attained, as described above. Consequently, it seems that the lower limit of β should be at least 0.1.

Thus, it can be seen that if the display element including the organic EL element 20 according to the present embodiment is configured such that the gate width W of the current control TFT 2 connected in series to the organic EL element 20 is reduced, then the conductive resistance of the current control TFT 2 when the organic EL element 20 is turned on can be made relatively higher, so that the display lifetime of the display element can be relatively prolonged.

As described above, with the display element according to the present embodiment and the display device including such a display element, it is preferable that the range of β during emission of the display element is set to $0.1 \leq \beta \leq 7$. Furthermore, when the withstand voltage of the current control TFT 2 is small (for example maximally 8 V), then it is preferable to set the range of β to $0.1 \leq \beta \leq 3$.

It should be noted that here, the method of adjusting the gate width of the current control TFT 2 has been shown as a method for setting the conductive resistance Rr of the current control TFT 2, but there is no limitation to this method, and it is also possible to use the method of adjusting the gate length as appropriate. It is furthermore possible to use the method of adjusting the doping amount of the CG silicon thin film 52 when fabricating the current control TFT 2. For example, the conductive resistance Rr increases the lower the injection amount (doping amount) of impurities (p-type impurities in this case) doped into the CG silicon thin film 52 is. Needless to say, when the doping amount becomes extremely low, then the switching function of the current control TFT 2 is compromised, so that there is a predetermined lower limit for the doping amount. Furthermore, the current control TFT 2 may also have an LDD (lightly doped drain) structure in which the CG silicon thin film 52 has a region doped with impurities at a relatively low concentration, and to use a method of setting the desired conductive resistance Rr by adjusting this structure as appropriate.

Thus, with the display element and display device of the present embodiment, it is possible to widen the pixel area (increase the numerical aperture) while prolonging the lifetime of the light emitting element, because it is not necessary to provide the display element shown in FIG. 4, which is of the constant voltage controlled type, with any additional elements or additional circuits. Moreover, since it is not necessary to provide the peripheral circuitry with additional circuits, it is possible to make the overall display device compact and simple. It should be noted that the configuration of this embodiment can also be applied easily to pixel circuits including three or more TFT elements.

With the present invention as described above, the conductive resistance of the current control element is set such that the ratio $\beta(=Vr/Vel)$ of the voltage Vr applied across the current control element to the voltage Vel applied across the electro-optical element when the electro-optical element is emitting light becomes $0.1 \leq \beta \leq 7.0$. Thus, it is possible to prolong the display lifetime of the electro-optical element, because the speed of the temporal change of the luminance of the electro-optical element can be slowed down without inserting a new resistance element and without adding special corrective circuits. On the other hand, with the subfield method or a method for gray scale control of electro-optical elements having different light emission surface areas with binary digital signals (see for example the method disclosed in JP H11-73158A), with which the influence of variations in the TFT characteristics can be reduced and a gray scale display with good control characteristics can be attained, a much higher emitted luminance than with analog gray scale displays is constantly necessary, so that the deterioration of the organic EL elements is sped up and the display lifetime is shortened. With the present invention, the electro-optical element in the display element of the above-described configuration is gray scale controlled by binary values, so that a superior display element and display device can be provided, that attain a gray scale display with favorable control characteristics while prolonging the conventional display lifetime even further.

While the invention has been described in detail, the foregoing description is in all aspects illustrative and not restrictive. It is understood that numerous other modifications an variations can be devised without departing from the scope of the invention.

This application claims priority upon Japanese Patent Application 2003-175481 titled "DISPLAY ELEMENT AND DISPLAY DEVICE," filed on Jun. 19, 2003, and Japanese Patent Application 2004-59620 titled "DISPLAY ELEMENT AND DISPLAY DEVICE," filed on Mar. 3, 2004, the contents of which are incorporated herein by reference.

What is claimed is:

1. A display element, comprising:
    an electro-optical element that is driven by a current;
    a current control element for letting a current flow through the electro-optical element by being connected in series to the electro-optical element;
    a switching element for applying to the current control element a data signal for controlling the current control element;
    a scanning signal line electrode for applying to the switching element a scanning signal for controlling the switching element;
    a data signal line electrode for applying to the switching element the data signal; and
    a power source line electrode for applying to the current control element a current for driving the electro-optical element;
    wherein the current control element has a predetermined conductive resistance satisfying $0.1 \leq \beta \leq 7.0$, where $\beta(=Vr/Vel)$ is a ratio of a voltage Vr applied across the current control element to a voltage Vel applied across the electro-optical element, when the electro-optical element is emitting light.

2. The display element according to claim 1, wherein the current control element has a predetermined conductive resistance satisfying $0.1 \leq \beta \leq 3.0$.

3. The display element according to claim 1, wherein the current control element is a thin film transistor.

4. The display element according to claim 3, wherein the current control element is a thin film transistor made of polycrystalline silicon.

5. The display element according to claim 3, wherein the current control element is a p-channel thin film transistor.

6. The display element according to claim 3, wherein the current control element is an n-channel thin film transistor.

7. The display element according to claim 3, wherein the current control element is formed so as to have the predetermined conductive resistance.

8. The display element according to claim 7, wherein the current control element has the predetermined conductive resistance due to a gate width or a gate length of the current control element being formed with a predetermined length.

9. The display element according to claim 1, wherein the electro-optical element is an organic electroluminescent element.

10. The display element according to claim 1, further comprising a capacitance portion for accumulating a charge corresponding to a voltage of the data signal, and holding a voltage for corresponding to that accumulated charge as a voltage for controlling the current control element.

11. The display element according to claim 1, wherein the data signal received by the current control element has a predetermined voltage in accordance with a predetermined gray level to be displayed.

12. The display element according to claim 1, wherein the data signal received by the current control element is a binary signal for turning the current control element ON or OFF.

13. A display device, comprising:
    a display portion in which a plurality of display elements according to claim 1 are arranged; and
    an image signal output portion applying the data signal having the predetermined voltage to the display elements.

14. The display device according to claim 13, wherein the electro-optical element included in the display elements is gray scale controlled by binary values, such that the electro-optical element takes on either an emitting or a non-emitting state.

15. The display device according to claim 13, wherein the current control element in the display elements is controlled by a voltage of the data signal from the image signal output portion to have a predetermined conductance satisfying $0.1 \leq \beta \leq 7.0$, when the electro-optical element is emitting light.

* * * * *